(12) United States Patent
Shizawa et al.

(10) Patent No.: US 8,364,101 B2
(45) Date of Patent: Jan. 29, 2013

(54) AMPLIFYING DEVICE AND TRANSMITTER APPARATUS

(75) Inventors: Yoshinobu Shizawa, Kawasaki (JP);
Hiroaki Maeda, Kawasaki (JP);
Yousuke Okazaki, Kawasaki (JP);
Hirotake Honda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 448 days.

(21) Appl. No.: 12/721,064

(22) Filed: Mar. 10, 2010

(65) Prior Publication Data

US 2010/0240329 A1   Sep. 23, 2010

(30) Foreign Application Priority Data

Mar. 19, 2009   (JP) .................................. 2009-68255

(51) Int. Cl.
*H04B 1/04* (2006.01)
*H01Q 11/12* (2006.01)
(52) U.S. Cl. ................... 455/114.3; 455/127.2; 375/297
(58) Field of Classification Search ............... 455/114.2, 455/114.3, 126, 127.1, 127.2, 127.3; 375/296, 375/297; 330/124 R, 129, 136, 277, 278, 330/291
See application file for complete search history.

(56) References Cited

U.S. PATENT DOCUMENTS

| | | | |
|---|---|---|---|
| 5,880,633 A | 3/1999 | Leizerovich et al. | |
| 5,903,823 A * | 5/1999 | Moriyama et al. | 455/126 |
| 6,081,698 A * | 6/2000 | Moriyama et al. | 455/126 |
| 6,418,173 B1 * | 7/2002 | Matsuoka et al. | 375/297 |
| 7,042,283 B2 * | 5/2006 | Suzuki et al. | 330/124 R |
| 7,170,345 B2 * | 1/2007 | Hongo | 330/278 |
| 7,268,617 B2 | 9/2007 | Kijima | |
| 7,427,895 B1 | 9/2008 | Okubo et al. | |
| 2001/0005402 A1 | 6/2001 | Nagatani et al. | |
| 2004/0174212 A1 | 9/2004 | Kim et al. | |
| 2006/0145757 A1 | 7/2006 | Kim et al. | |
| 2006/0152279 A1 | 7/2006 | Kijima | |

FOREIGN PATENT DOCUMENTS

| | | |
|---|---|---|
| EP | 1 492 228 | 12/2004 |
| JP | 2004-96729 | 3/2004 |
| JP | 2006-173722 | 6/2006 |
| JP | 2006-191590 | 7/2006 |
| JP | 2007-116259 | 5/2007 |

(Continued)

OTHER PUBLICATIONS

European Search Report dated Jun. 9, 2010, from the corresponding European Application.

(Continued)

*Primary Examiner* — Quochien B Vuong
(74) *Attorney, Agent, or Firm* — Katten Muchin Rosenman LLP

(57) ABSTRACT

An amplifying device includes an amplifier including a first amplifying element with a drain voltage thereof being controlled, and a second amplifying element, the amplifier amplifying a transmission signal with the first and second amplifying elements, synthesizing the transmission signals amplified by the first and second amplifying elements, and outputting the synthesized transmission signal; a distortion compensator part which performs distortion compensation on the input signal in accordance with a compensation coefficient derived from a difference between a input signal and a feedback signal generated from a portion of a signal output from the amplifier; and a controller part which controls the drain voltage of the first amplifying element in response to a result of a comparison between a power level of the input signal prior to the distortion compensation operation by the distortion compensator part and a threshold value.

8 Claims, 12 Drawing Sheets

FOREIGN PATENT DOCUMENTS

| | | |
|---|---|---|
| JP | 2008-22513 | 1/2008 |
| JP | 2008-131186 | 6/2008 |
| JP | 2008-147857 | 6/2008 |

OTHER PUBLICATIONS

Wan-Jong Kim, et al. "Digital Predistortion of a Doherty Amplifier with a Weak Memory within a Connected Solution" 2004 IEEE 60th Vehicular Technology Conference, vol. 3, Sep. 26, 2004, pp. 2020-2023.

Fumitaka Iizuka, et al. "High-Efficiency Doherty Linear Amplifier with Backoff Control for Mobile Communications" Vehicular Technology Conference, 2005, vol. 2, May 30, 2005, pp. 949-953.

Notification of Reason for Refusal dated Aug. 21, 2012, from corresponding Japanese Application No. 2009-068255.

* cited by examiner

FIG. 4A

| $|X(t)|^2$ | ADDRESS VALUE | COMPENSATION COEFFICIENT |
|---|---|---|
| $p_0$ | 0 | $h(p_0)$ |
| $p_1$ | 1 | $h(p_1)$ |
| $p_2$ | 2 | $h(p_2)$ |
| ⋮ | ⋮ | ⋮ |
| $p_{1023}$ | 1023 | $h(p_{1023})$ |

FIG. 4B

| $|X(t)|^2$ | ADDRESS VALUE | Vds CONTROL COEFFICIENT |
|---|---|---|
| $p_0$ | 0 | $hvds(p_0)$ |
| $p_1$ | 1 | $hvds(p_1)$ |
| $p_2$ | 2 | $hvds(p_2)$ |
| ⋮ | ⋮ | ⋮ |
| $p_{1023}$ | 1023 | $hvds(p_{1023})$ |

FIG. 4C

| $|X(t)|^2$ | ADDRESS VALUE | CORRECTION COEFFICIENT |
|---|---|---|
| $p_0$ | 0 | $hv(p_0)$ |
| $p_1$ | 1 | $hv(p_1)$ |
| $p_2$ | 2 | $hv(p_2)$ |
| ⋮ | ⋮ | ⋮ |
| $p_{1023}$ | 1023 | $hv(p_{1023})$ |

DVC OPERATION

Vds = Vds1

AMPLIFYING DEVICE AND TRANSMITTER
APPARATUS

CROSS-REFERENCE TO RELATED
APPLICATIONS

This application is based upon and claims the benefit of priority of the prior Japanese Patent Application No. 2009-68255, filed on Mar. 19, 2009, the entire contents of which are incorporated herein by reference.

FIELD

The present invention relates to an amplifying device and a transmitter apparatus in a radio-communication system, the amplifying device and the transmitter apparatus each including an amplifier for amplifying a transmission signal.

BACKGROUND

A transmitter apparatus for use in radio communications typically includes a power amplifying device. A high efficiency and a small distortion property are required for the power amplifying device. To achieve a high efficiency, Doherty amplifiers have been recently used for the power amplifying device. To reduce non-linear distortion, a distortion compensator circuit is also used together with the amplifier.

The Doherty amplifier unit includes a carrier amplifier and a peak amplifier. The carrier amplifier is designed to operate at a relatively high linearity with a class AB bias setting. The peak amplifier operates with a class C bias setting. The carrier amplifier constantly amplifies an input signal, while the peak amplifier does not amplify if an input signal has a low instantaneous power and amplifies an input signal at a peak power if the input signal has a high instantaneous power. The peak amplifier operates at a low power consumption when the instantaneous power of the input signal is low. When the instantaneous power is high, the output of the carrier amplifier and the output of the peak amplifier are synthesized into a high power output signal. In this way, the Doherty amplifier achieves a high power efficiency.

On the other hand, the linearity of the Doherty amplifier is insufficient. For example, distortion is generated in an amplified transmission signal due to AM-AM characteristics (input amplitude to output amplitude characteristics) and AM-PM characteristics (input amplitude to output phase characteristics). As illustrated in FIG. 10A, non-linear distortion is generated due to the non-linear characteristics of the AM-AM characteristics in a high input power region. As illustrated in FIG. 10B, sidelobes appear in the frequency characteristics, causing non-linear distortion. A signal is likely to leak into an adjacent channel in radio communications, thereby becoming noise on the adjacent channel. Communication quality is thus degraded. In particular, current transmitter devices used in radio communications have a high peak-to-average power ratio (PAPR), and linearity is required of the transmitter devices in a wide range of power. Due to insufficient linearity properties, the Doherty amplifier suffers from non-linearity problems.

In order to overcome the problem of the Doherty amplifier, a distortion compensator circuit such as a pre-distortion circuit is provided. In view of the non-linearity characteristics, a pre-distortion compensator circuit pre-distorts an input signal prior to amplification in order to overcome the non-linear distortion by multiplying the input signal by a compensation coefficient representing the inverse of non-linearity characteristics. When the input signal thus compensated is amplified by an amplifier, the characteristics inverse to the non-linearity characteristics and the non-linearity characteristics cancel each other out. The input signal prior to compensation is thus linearly amplified. As illustrated in FIG. 11A, the gain of the Doherty amplifier is lowered in a region where the amplitude of the baseband signal is large. By compensating for distortion with characteristics illustrated in FIG. 11B inverse to the gain characteristics, the gain is set to be constant regardless of the amplitude of the baseband signal.

FIG. 12 illustrates a transmitter apparatus 100 including a distortion compensator and a power amplifier based on the related art. The transmitter apparatus 100 includes a transmitter system 102 and a feedback system 130.

The transmitter system 102 includes baseband signal generator 104, serial-parallel converter 106, distortion compensator 108, digital-to-analog converter 110, orthogonal modulator 112, power amplifier 118, and antenna 120.

The baseband signal generator 104 generates, as a serial signal, a baseband signal composed of a digital in-phase (I) signal and a digital quadrature-phase (Q) signal. The serial-parallel converter 106 serial-to-parallel converts the two signals, i.e., the I signal and the Q signal. In order to compensate for the non-linearity of the power amplifier, the distortion compensator 108 pre-compensates for distortion by multiplying the I signal and the Q signal by a compensation coefficient. The digital-to-analog converter 110 digital-to-analog converts the compensated I signal and Q signal. The orthogonal modulator 112 orthogonally modulates the analog I signal and Q signal, thereby generating a transmission signal. The power amplifier 118 amplifies the transmission signal output from the orthogonal modulator 112 and outputs the amplified transmission signal. The antenna 120 emits a radiowave corresponding to the transmission signal amplified by the power amplifier 118.

The feedback system 130 includes directional coupler 132, frequency-converter 134, and analog-to-digital converter 138.

The directional coupler 132 separates part of the transmission signal output from the power amplifier 118 from the transmission signal, and the down-converter 134 frequency-converts the separated part of the transmission signal in a down-conversion operation. The analog-to-digital converter 138 analog-to-digital converts the input signal into a digital signal, thereby generating a feedback signal. The feedback signal output from the analog-to-digital converter 138 is supplied to the distortion compensator 108, which uses the feedback signal to generate a compensation coefficient.

Japanese Laid-open Patent Publication No. 2008-131186 discloses a power amplifier which works with low non-linearity distortion at a high efficiency and provides highly accurate distortion compensation corresponding to an output signal.

The disclosed power amplifier includes a Doherty amplifier, a pre-distortion unit, and a bias controller. The bias controller, having a bias control table storing information of an input power and information a gate voltage in a mapped state, controls a gate voltage of a peak amplifier by referencing the bias control table in response to a detected input power. The bias control table of the power amplifier maps the input voltage to a class C gate voltage when the input voltage is low, and maps the input voltage to a class AB gate voltage when the input voltage is high. The power amplifier also includes a distortion detector for detecting non-linear distortion in an output signal of the Doherty amplifier, and a controller. The controller adaptively updates the inverse of the characteristics of the pre-distortion unit and the bias control table in response to non-linear distortion detected by the distortion detector so that non-linear distortion is reduced.

The Doherty amplifier in the power amplifier unit disclosed above sometimes fails to output a sufficient output power in the vicinity of a peak output power. The transmitter apparatus illustrated in FIG. 12 may also suffer from the same problem.

SUMMARY

According to an aspect of the invention, there is provided an amplifying device for generating a transmission signal by processing an input signal, and amplifying and transmitting the transmission signal. The amplifying device includes an amplifier including a first amplifying element with a drain voltage thereof being controlled, and a second amplifying element, the amplifier amplifying the transmission signal with the first and second amplifying elements, synthesizing the transmission signals amplified by the first and second amplifying elements, and outputting the synthesized transmission signal; a distortion compensator part which performs a distortion compensation operation on the input signal in accordance with a compensation coefficient, the compensation coefficient being derived from a difference between the input signal and a feedback signal generated from a portion of a signal output from the amplifier; and a controller part which controls the drain voltage of the first amplifying element in response to a result of a comparison between a power level of the input signal prior to the distortion compensation operation by the distortion compensator part, and a threshold value.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIGS. 4A-4C illustrate reference tables used by the transmitter apparatus of FIG. 1.

DESCRIPTION OF EMBODIMENTS

Embodiments of a power amplifying device and a transmitter apparatus are described below.

Structure of the Transmitter Apparatus

Figure 1:
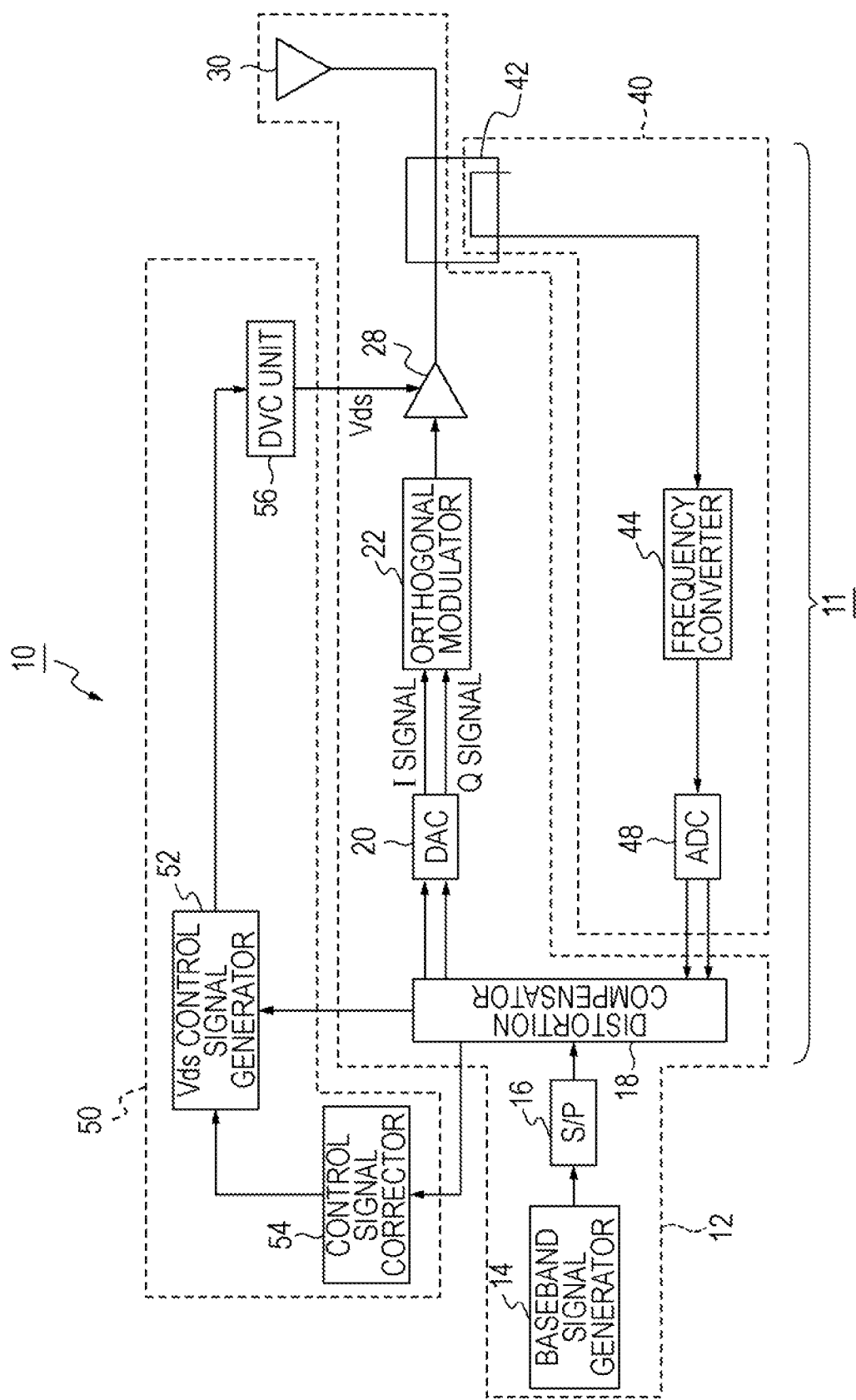
FIG. 1 is a block diagram of a transmitter apparatus in accordance with a first embodiment of the present invention.
Figure 2:
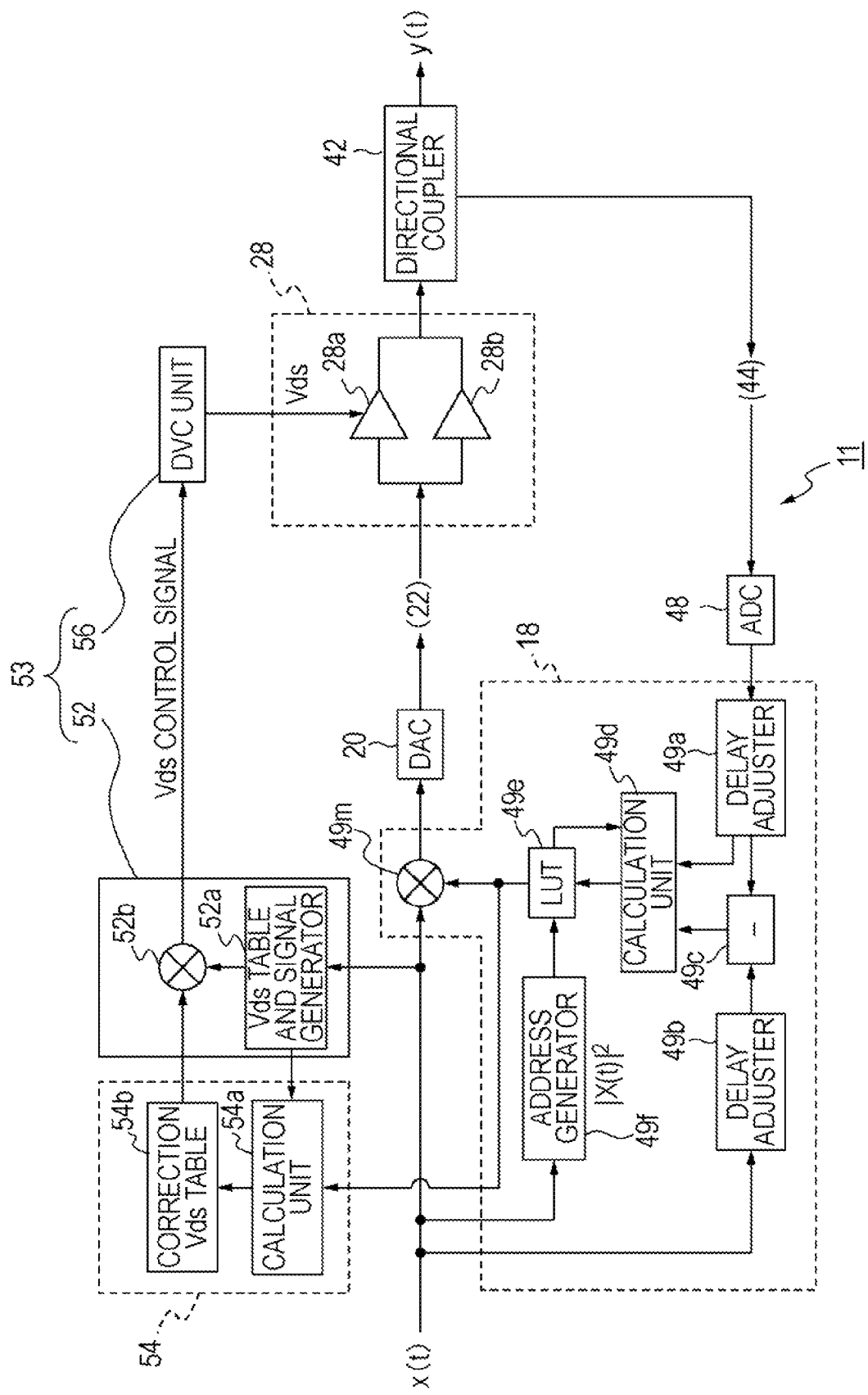
FIG. 2 is a block diagram of a power amplifying device for use in the transmitter apparatus of FIG. 1.

FIG. 1 illustrates a structure of a transmitter apparatus 10 in accordance with an embodiment of the present invention. FIG. 2 is a block diagram of a power amplifying device 11 in the transmitter apparatus 10. The power amplifying device 11 includes a power amplifier 28 as a Doherty amplifier, and conducts operations between a distortion compensator 18 and a directional coupler 42.

The transmitter apparatus 10 includes a transmitter system 12, a feedback system 40, and a drain voltage control system 50.

The transmitter apparatus 10 performs a distortion compensation process on an input signal composed of an I signal and a Q signal, as a baseband signal, using a compensation coefficient generated from a signal (hereinafter referred to as feedback signal) which is a separated part of an output signal. The transmitter apparatus 10 amplifies a transmission signal using, as a power amplifier 28, a Doherty amplifier including a carrier amplifier 28a (see FIG. 2) and a peak amplifier 28b (see FIG. 2). In the amplification operation, a drain voltage of the carrier amplifier 28a of the Doherty amplifier is controlled. The drain voltage is controlled by a drain voltage control signal that is generated based on a power level of the input signal prior to distortion compensation. The power level is derived from an envelope signal of the input signal containing the I signal and the Q signal as the baseband signal. When the power level of the input signal exceeds a certain threshold level, the transmitter apparatus 10 corrects the drain voltage control signal so that a phase of the output of the carrier amplifier 28a becomes close to a phase of the output of the peak amplifier 28b.

Transmitter System

The transmitter system 12 in the transmitter apparatus 10 includes a baseband signal generator 14, a serial-parallel converter 16, a distortion compensator 18, a digital-to-analog converter 20, an orthogonal modulator 22, the power amplifier 28, and an antenna 30.

The baseband signal generator 14 generates a serial signal containing the I signal and the Q signal, as a digital baseband signal. The serial-parallel converter 16 generates an input signal by serial-to-parallel converting the two signals, i.e., the I signal and the Q signal, into parallel signals, thereby generating an input signal. In order to compensate for non-linearity, the distortion compensator 18 performs a distortion compensation process by multiplying the I signal and the Q signal by a compensation coefficient. The digital-to-analog converter 20 digital-to-analog converts the distortion-compensated I and Q signals into analog signals. The orthogonal modulator 22 orthogonally converts the analog I and Q signals. In this case, the orthogonal modulator 22 also frequency upconverts the signals, thereby generating a transmission signal. The power amplifier 28 amplifies the transmission signal, and the antenna 30 emits a radiowave corresponding to the amplified transmission signal. The distortion compensator 18 and the power amplifier 28 are described later.

Feedback System

The feedback system 40 in the transmitter apparatus 10 includes the directional coupler 42, a frequency converter 44, and an analog-to-digital converter 48.

The directional coupler 42 separates part of the transmission signal amplified by the power amplifier 28 and the frequency converter 44 down-converts the separated transmission signal. The analog-to-digital converter 48 analog-to-digital converts the input signal, thereby generating the feedback signal. A circuit in the distortion compensator 18 converts the generated feedback signal into a feedback signal corresponding to the input signal (I signal and Q signal), and the resulting feedback signal is used to generate a compensation coefficient. The directional coupler 42, the frequency converter 44, the analog-to-digital converter 48, and the circuit within the distortion compensator 18 operate as a feedback processor to generate the digital feedback signal from the transmission signal.

Drain Voltage Control System

The drain voltage control system 50 in the transmitter apparatus 10 includes a Vds control signal generator 52, a control signal corrector 54, and a drain voltage control (DVC) unit 56. A digital signal processor (DSP) may be used for the Vds control signal generator 52 and the control signal corrector 54, for example.

The drain voltage control system 50 calculates the power level of the input signal using an envelope signal generated from the input signal, and generates, in response to the power level, the drain voltage control signal controlling a drain voltage Vds. The drain voltage control signal causes the DVC unit 56 to output the drain voltage Vds, thereby controlling the drain voltage Vds of the carrier amplifier 28a. When the power level of the input signal exceeds a certain threshold value, the drain voltage control signal is corrected so that the phase of the output of the carrier amplifier 28a in the power amplifier 28 becomes close to the phase of the output of the peak amplifier 28b in the power amplifier 28. More specifically, when the power level of the input signal exceeds the certain threshold, a correction is accounted for in the controlling of the drain voltage.

To achieve a high efficiency amplification, the power amplifier 28 is operated in the vicinity of a saturation region (in the vicinity of a peak power) when the power level of the input signal exceeds the certain threshold value. The power efficiency may be thus increased by controlling the drain voltage Vds in response to the power level of the input signal. The Vds control signal generator 52, the control signal corrector 54, and the DVC unit 56 are described later.

Power Amplifying Device

The power amplifier 28 in the transmitter system 12 is a Doherty amplifier unit including the carrier amplifier 28a and the peak amplifier 28b. The power amplifier 28 synthesizes the outputs amplified and output by the carrier amplifier 28a and the peak amplifier 28b as amplifying elements and outputs the resulting signal as the transmission signal. The DVC unit 56 supplies the drain voltage Vds to the carrier amplifier 28a to control the carrier amplifier 28a. The input signal is thus amplified in power at a high efficiency by controlling the drain voltage Vds sent to the carrier amplifier 28a. By controlling the drain voltage Vds sent to the carrier amplifier 28a with an output power in the vicinity of the peak value thereof, the output of the carrier amplifier 28a is substantially in phase with the output of the peak amplifier 28b so that the output power is increased. Whether the output power is in the vicinity of the peak value thereof is determined based on whether the power level of the input signal exceeds the certain threshold value. The drain voltage Vds of the carrier amplifier 28a rather than the peak amplifier 28b is controlled because the area of active operations of the peak amplifier 28b may be low, and even if the drain voltage of the peak amplifier 28b is controlled, the effect of control may be small. No elements other than the carrier amplifier 28a and the peak amplifier 28b are illustrated in the power amplifier 28, but the power amplifier 28 may also include a divider and a quarter-wavelength line.

Distortion Compensator

The distortion compensator 18 of FIG. 2 in the transmitter system 12 is fabricated of a digital signal processor (DSP), and includes delay adjusters 49a and 49b, a difference calculator 49c, a calculation unit 49d, a look-up table (LUT) 49e, and an address generator 49f.

The delay adjuster 49a adjusts a delay of the feedback signal supplied from the analog-to-digital converter 48, and the delay adjuster 49b adjusts a delay of the input signal prior to the distortion compensation process. The difference calculator 49c calculates a difference between the input signal and the feedback signal corresponding to the input signal. When the difference between the input signal and the feedback signal is calculated, the delay adjusters 49a and 49b adjust the timings of the feedback signal and the input signal, respectively.

Based on the difference calculated by the difference calculator 49c, the calculation unit 49d calculates, from the previously calculated compensation coefficient $h_n(p)$, a compensation coefficient $h_{n+1}(p)$ that is to be multiplied by the input signal. Here, n represents the number of repetitions, p represents the power of the input signal (input power), and p=(I2+Q2) (where I represents the value of the I signal and Q represents the value of the Q signal). A compensation coefficient $h_k(p)$ (where k is an integer equal to or larger than 1) is repeatedly calculated in response to the difference between the input signal and the feedback signal (hereinafter the compensation coefficient is generally represented by $h_k(p)$). Here, p may be (I2+Q2)(½) instead of (I2+Q2).

Figure 3:
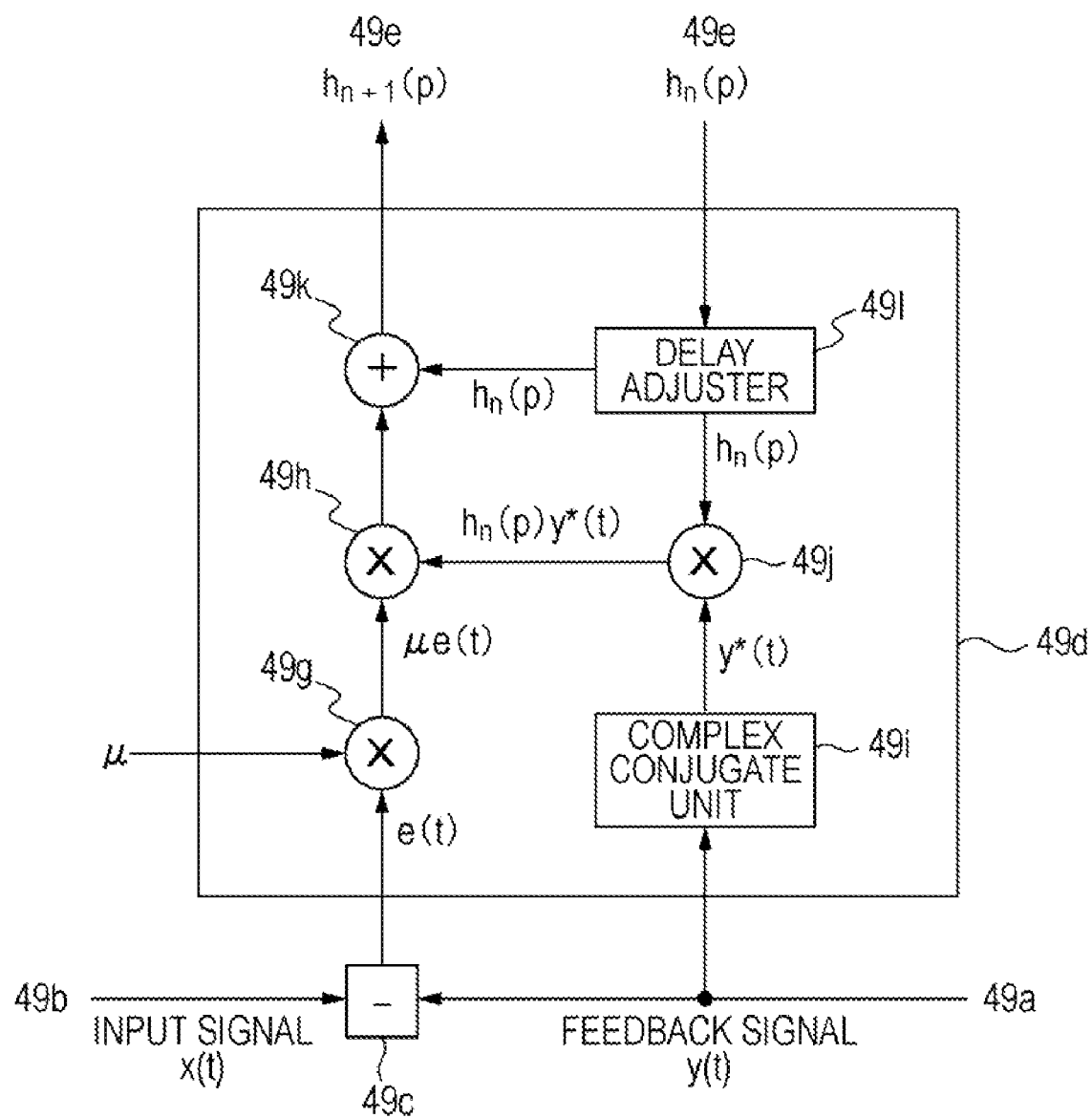
FIG. 3 illustrates a distortion compensator used in the transmitter apparatus of FIG. 1.

FIG. 3 illustrates a process for calculating, from the previously calculated n-th compensation coefficient $h_n(p)$, the (n+1)-th compensation coefficient $h_{n+1}(p)$. The compensation coefficient $h_{n+1}(p)$ is calculated through an adaptive signal process based on the least mean square (LMS) algorithm as described below.

x(t) represents the input signal composed of the I signal and the Q signal in a complex number form, y(t) represents the feedback signal corresponding to the input signal in a complex number form, and e(t) represents the difference between x(t) and y(t).

A multiplier 49g multiplies the difference e(t) by µ representing a step parameter size of an update quantity. A multiplier 49h multiplies the resulting product by $h_n(p) \cdot y^*(t)$ (where y*(t) is the complex conjugate of y(t)). Using a multiplier 49j, a result of $h_n(p) \cdot y^*(t)$ is derived by multiplying, by the compensation coefficient $h_n(p)$, a complex conjugate feedback signal y*(t) that is generated by a complex conjugate generation unit 49i from the feedback signal y(t). Using an adder 49k to add the n-th compensation coefficient $h_n(p)$ to $h_n(p) \cdot y^*(t) \cdot \mu \cdot e(t)$ calculated by the multiplier 49h results in the (n+1)-th compensation coefficient $h_{n+1}(p)$. The n-th compensation coefficient $h_n(p)$ used by the adder 49k and the multiplier 49j is adjusted by the delay adjuster 49l for the addition operation of the adder 49k.

The look-up table (LUT) 49e records a compensation coefficient $h_k(p)$ successively calculated by the calculation unit 49d (where k is an integer equal to or larger than 1), as the compensation coefficient h(p), in association with an address value determined by a power p of the input signal. When supplied with an address signal by the address generator 49f to be discussed later, the LUT 49e references and extracts the compensation coefficient h(p) corresponding to the power p of the input signal in the LUT 49e in response to the address signal. The LUT 49e outputs the compensation coefficient h(p) to a multiplier 49m.

The address generator 49f generates the envelope signal of the input signal from the input signal x(t) prior to distortion compensation, and generates the address signal in response to the power p determined from the envelope signal. The address signal has an address value of 10 bits determined in response to the level of the power p, which may be a value of 1 through 1023. When the LUT 49e updates the compensation coefficient to $h_{n+1}(p)$, the address signal is to be delayed. To this end, the address generator 49f includes a delay adjuster.

The LUT 49e extracts the compensation coefficient h(p) corresponding to the address value of the address signal supplied from the address generator 49f as illustrated in FIG. 4A. The multiplier 49m thus multiplies the input signal x(t) by the compensation coefficient h(p). The input signal x(t) contains the I signal and the Q signal, and the compensation coefficient h(p) has two values, a real part and an imaginary part, corresponding to the I signal and the Q signal. The multiplier 49m thus performs a multiplication process accounting for the signals and the values thereof.

The LUT 49e supplies the control signal corrector 54 with the compensation coefficient h(p) for use in distortion compensation, and the power p corresponding to the address value.

FIG. 4A illustrates one example of a reference table contained in the LUT 49e. An address value corresponding to a power $p_i$ into which the power of the input signal is quantized is set, and the compensation coefficient $h(p_i)$ (where i is in a range from 0 to 1023) is listed for each address value in the reference table.

Vds Control Signal Generator, Control Signal Compensator, and DVC Unit

As illustrated in FIG. 2, the Vds control signal generator 52 in the drain voltage control system 50 includes a Vds table and signal generator 52a for generating the drain voltage control signal, and a multiplier 52b that corrects the drain voltage control signal by multiplying the drain voltage control signal by a correction coefficient. The Vds control signal generator 52 supplies the DVC unit 56 with the corrected drain voltage control signal.

The Vds table and signal generator 52a includes a power extractor and a Vds reference table. The power extractor calculates the envelope signal of the input signal x(t) prior to distortion compensation to determine the power level of the input signal and outputs the address value corresponding to the power level. The Vds reference table records a Vds control coefficient that is used for the DVC unit 56 to output a desired drain voltage Vds. The Vds reference table selects the Vds control coefficient corresponding to the address value output by the power extractor and outputs the selected Vds control coefficient.

The multiplier 52b corrects the Vds control coefficient output from the Vds table and signal generator 52a by multiplying the Vds control coefficient by the correction coefficient supplied from the control signal corrector 54 to be discussed later. The multiplier 52b outputs the resulting product as a Vds control signal. In response to the Vds control signal, the power amplifier 28 amplifies the transmission signal at a high efficiency.

FIG. 4B illustrates an example of the Vds reference table. The address value corresponding to the level of the power $p_i$ into which the input signal is quantized is set in the Vds reference table. The power $p_i$ may be referred to as power level. A value $hvds(p_i)$ (where i is an integer in a range from 0 to 1023), which is the Vds control coefficient, is recorded for the respective address value on the reference table.

As illustrated in FIG. 2, the control signal corrector 54 includes a calculation unit 54a and a correction Vds table 54b.

The calculation unit 54a calculates the correction coefficient $hv(p_i)$ using the power $p_i$ supplied by the LUT 49e and the compensation coefficient $h(p_i)$).

More specifically, when the level of the power $p_i$ of the input signal exceeds the certain threshold value, the correction coefficient is determined so that the phase of the output of the carrier amplifier 28a becomes close to the phase of the output of the peak amplifier 28b. The level of the power $p_i$ of the input signal may exceed the certain threshold value when the output power of the transmission signal output from the power amplifier 28 is in the vicinity of the peak value thereof.

Whether to increase or decrease the drain voltage Vds in correction to cause the phase of the output of the carrier amplifier 28a to become close to the phase of the output of the peak amplifier 28b depends on the phase characteristics of the carrier amplifier 28a and the peak amplifier 28b and thus may not be determined in a simple fashion. The calculation unit 54a adjusts and calculates the correction coefficient so that the absolute value of the compensation coefficient $h(p_i)$ corresponding to the peak power at which the level of the power $p_i$ of the input signal supplied from the LUT 49e exceeds the certain threshold value becomes smaller, preferably, to a minimum value.

Figure 5:
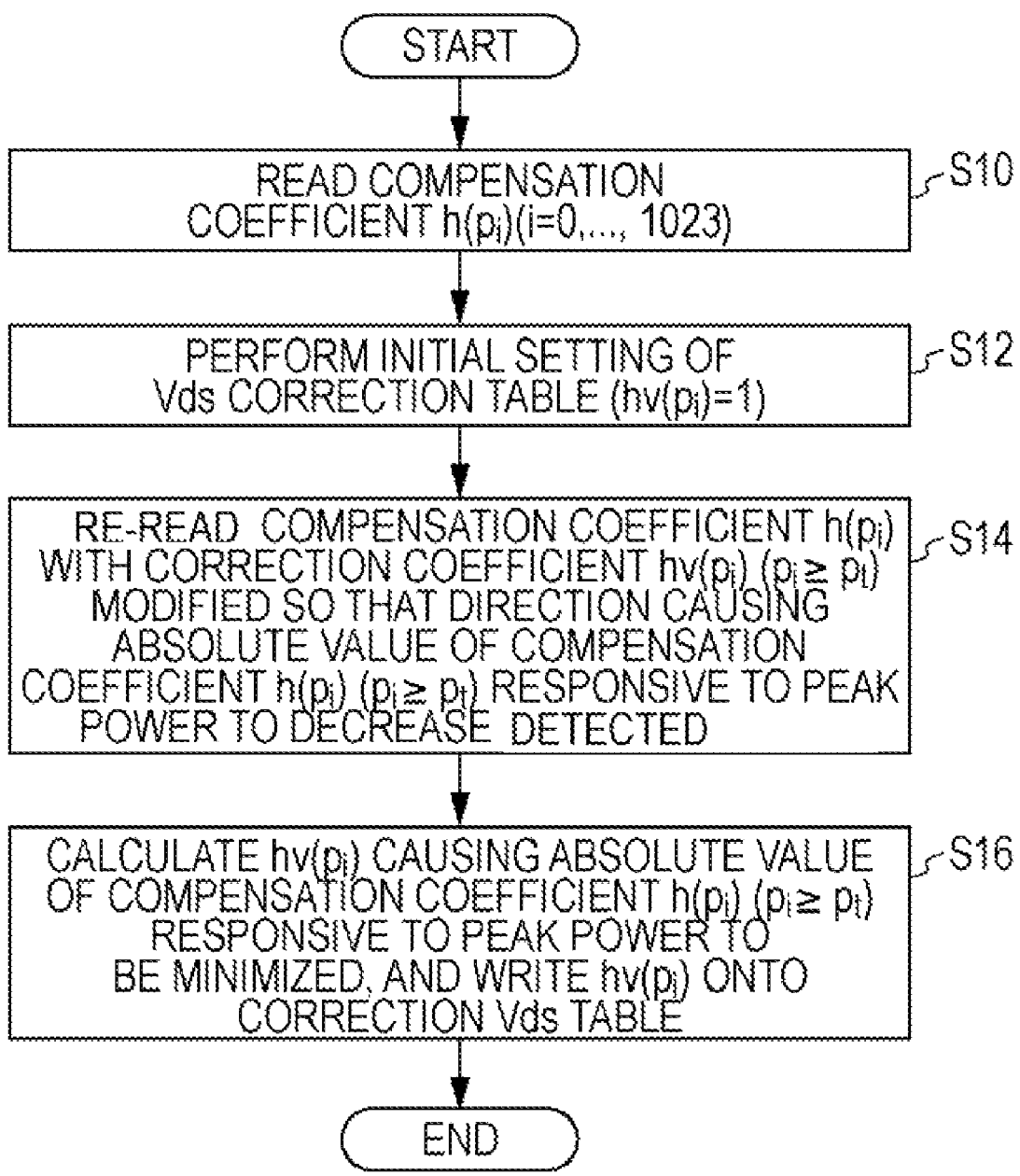
FIG. 5 is a flowchart of a calculation process of a correction coefficient performed by a control signal corrector of the transmitter apparatus of FIG. 1.

FIG. 5 is a flowchart illustrating a flow of a calculation of the correction coefficient $hv(p_i)$ performed by the calculation unit 54a.

The calculation unit 54a reads and acquires the compensation coefficient $h(p_i)$ (i=0-1023) recorded in the LUT 49e (step S10).

The correction coefficients $hv(p_i)$ in the correction Vds table 54b are initialized (step S12). In this case, all the correction coefficients $hv(p_i)$ are initialized to 1. The correction coefficient $hv(p_i)$ is a value that is multiplied by the drain voltage Vds by the multiplier 52b. If the correction coefficient $hv(p_i)$ is 1, the Vds control signal is not corrected.

Let $p_t$ represent a threshold value that is to be compared with the power $p_i$ of the input signal. By modifying the correction coefficient $hv(p_i)$ satisfying $p_i \geq p_t$, the power amplifier 28 is operated and the distortion compensator 18 is also operated. The calculation unit 54a re-reads the compensation coefficient $h(p_i)$ to be recorded onto the LUT 49e and determines whether the absolute value of the compensation coefficient $h(p_i)$ has become smaller or not. The compensation coefficient $h(p_i)$ to be recorded onto the LUT 49e is the one that the calculation unit 49d has calculated and updated. By modifying the correction coefficient $hv(p_i)$, the update direction of the correction coefficient $hv(p_i)$ in which the absolute value of the compensation coefficient $h(p_i)$ corresponding to the peak power becomes smaller is detected (step S14).

The calculation unit 54a calculates the correction coefficient $hv(p_i)$ minimizing the absolute value of the compensation coefficient $h(p_i)$ in accordance with the update direction of the detected correction coefficient $hv(p_i)$. The calculation unit 54a writes the compensation coefficient $h(p_i)$ in the Vds correction table, thereby updating the Vds correction table (step S16). The calculation unit 54a corrects the drain voltage control signal so that the absolute value of the compensation coefficient $h(p_i)$ corresponding to the peak power becomes smaller.

The reason why the correction coefficient $hv(p_i)$ is calculated through the above-described method is described below. When the level of the power $p_i$ of the input signal exceeds the threshold value $p_t$, e.g., when the phase of the output of the carrier amplifier 28a becomes extremely close to the phase of the output of the peak amplifier 28b with the drain voltage Vds controlled in the vicinity of the peak power, the outputs may be synthesized in phase. Thus, the output power of the amplified transmission signal increases. A gain decrease corresponding to the peak power is controlled. The calculation unit 49d calculates the compensation coefficient h($p_i$) having a smaller absolute value (closer to 1) and the LUT 49e is updated.

The calculation unit 54a thus determines whether the level of the power $p_i$ of the input signal is higher than the threshold value $p_t$. When the level of the power $p_i$ of the input signal exceeds the threshold value $p_t$, the calculation unit 54a calculates the correction coefficient hv($p_i$) so that the compensation coefficient h($p_i$) corresponding to the peak power is minimized. The calculated compensation coefficient h($p_i$) is stored in the correction Vds table 54b on a per level basis of the power $p_i$ of the input signal.

The correction Vds table 54b records the correction coefficient hv($p_i$) corresponding to the level of the power $p_i$. The correction coefficient hv($p_i$) is read from the correction Vds table 54b in response to the supplying of the power $p_i$, and supplied to the multiplier 52b.

FIG. 4C illustrates an example of the correction Vds table 54b. An address value corresponding to the power $p_i$ into which the power of the input signal is quantized is set, and the correction coefficient hv($p_i$) (where i is an integer in a range from 0 to 1023) is recorded for each address value on the reference table.

The reference table of the LUT 49e, the Vds reference table of the Vds table and signal generator 52a, and the reference table of the correction Vds table 54b list values set for each level of the power $p_i$ of the input signal. The compensation coefficient h($p_i$), the Vds control coefficient of the drain voltage control signal, and the correction coefficient hv($p_i$) are obtained by referencing these tables.

The DVC unit 56 includes a digital-to-analog converter and an output unit. The digital-to-analog converter digital-to-analog converts the Vds control signal supplied from the Vds control signal generator 52 into an analog signal. The output unit outputs the drain voltage Vds to be supplied to a drain terminal of the carrier amplifier 28a in response to the analog converted Vds control signal. The drain voltage Vds output from the DVC unit 56 is applied to the drain terminal of the carrier amplifier 28a. The DVC unit 56 together with the Vds control signal generator 52 make up a drain voltage controller 53.

The transmitter apparatus 10 is constructed as described above. The transmitter apparatus 10 may be used for an optical feeder base station. The power amplifying device 11 illustrated in FIG. 1 includes the distortion compensator 18, the power amplifier 28, a drain voltage controller 53 made up of the Vds control signal generator 52 and the DVC unit 56, and the control signal corrector 54.

Operation of the Transmitter Apparatus

In the transmitter apparatus 10, the input signal is generated as a baseband signal and converted into a parallel signal. The parallel converted input signal is supplied to the distortion compensator 18 and the Vds table and signal generator 52a. The Vds table and signal generator 52a generates the envelope signal in response to the input signal, calculates the power $p_i$ of the input signal from the envelope signal, acquires the Vds control coefficient of the Vds control signal prior to correction using the reference table thereof, and supplies the Vds control coefficient to the multiplier 52b. When the level of the power $p_i$ of the input signal generated based on the envelope signal output from the LUT 49e exceeds the threshold value, the correction coefficient hv($p_i$) corresponding to the level of the power $p_i$ is read from the correction Vds table 54b and supplied to the multiplier 52b. The correction coefficient hv($p_i$) is calculated by the calculation unit 54a, and recorded in the correction Vds table 54b in association with the power $p_i$, and updated. The multiplier 52b multiplies the supplied correction coefficient by the Vds control coefficient supplied from the Vds table and signal generator 52a, and outputs the resulting product as the Vds control signal to the DVC unit 56. Based on the supplied the Vds control signal, the DVC unit 56 supplies the drain voltage Vds to the drain terminal of the carrier amplifier 28a.

The distortion compensator 18 multiplies the input signal by the compensation coefficient $h_k(p_i)$ determined according to the level of the power $p_i$ of the input signal, thereby performing a distortion compensation process. The distortion compensated input signal is converted into an analog signal, and orthogonally modulated as the transmission signal. The transmission signal is supplied to the power amplifier 28 that is a Doherty amplifier. The carrier amplifier 28a is controlled by the drain voltage Vds supplied from the DVC unit 56. The phase of the output of the carrier amplifier 28a becomes close to the phase of the output of the peak amplifier 28b when the output power is in the vicinity of the peak value thereof. The outputs of the carrier amplifier 28a and the peak amplifier 28b are substantially synthesized in phase. The output power of the synthesized and amplified transmission signal is thus increased. The transmission signal is output in the form of radiowave via the antenna 30.

Part of the amplified transmission signal is separated from the rest of the amplified transmission signal by the directional coupler 42 and applied to the feedback system 40. The frequency converter 44 and the analog-to-digital converter 48 respectively perform the frequency down-conversion and the analog-to-digital conversion on the part of the transmission signal in succession. Thus, the feedback signal y(t) corresponding to the input signal x(t) containing the I signal and the Q signal is generated. The feedback signal y(t) is supplied to the distortion compensator 18.

The distortion compensator 18 timing adjusts the input signal x(t) and the feedback signal y(t), and calculates the difference e(t) between the input signal x(t) and the feedback signal y(t). The compensation coefficient $h_k(p)$ minimizing the difference e(t) is calculated in accordance with a certain equation. The calculated compensation coefficient $h_k(p)$ is recorded into the LUT 49e in association with the address signal, i.e., the signal representing the level of the envelope signal, supplied from the address generator 49f. The compensation coefficient $h_k(p)$, once stored in the LUT 49e, remains un-updated unless the calculation unit 49d calculates the compensation coefficient of a new value. If the value of the compensation coefficient remains un-updated, the compensation coefficient corresponding to the address signal is read from the LUT 49e and supplied to the multiplier 49m. If the value of the compensation coefficient is to be updated, the value of the compensation coefficient is updated in the LUT 49e, and the updated value is read and supplied to the multiplier 49m.

The non-linearity of the transmission signal may be reduced through the distortion compensation process, and the output power may be increased due to the control of the drain voltage Vds of the carrier amplifier 28a. The transmission signal may be decreased more in a low-power region due to the control of the drain voltage Vds than when the drain voltage Vds fixed. Thus, efficiency of the amplifying device may be increased. When the level of the power of the input signal exceeds the threshold value, the drain voltage Vds is controlled so that the phase of the output of the carrier amplifier 28a becomes close and substantially equal to the phase of the output of the peak amplifier 28b. The output power in the vicinity of the peak value thereof may be increased even more.

Figure 6A:
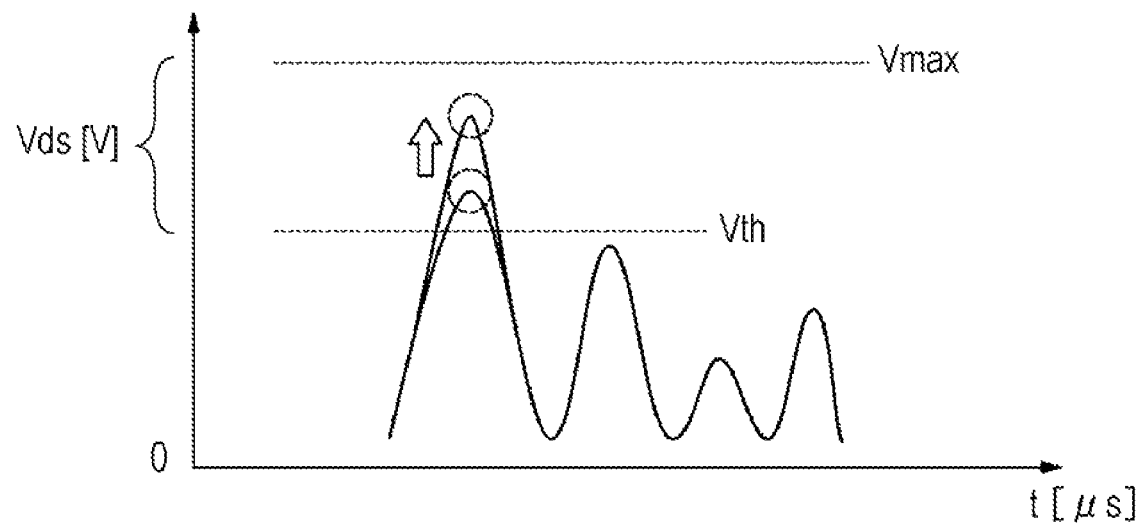
FIGS. 6A and 6B illustrate a drain voltage control process of the transmitter apparatus of FIG. 1.

FIG. 6A illustrates the drain voltage Vds output from the DVC unit 56 when the drain voltage Vds increases due to the drain voltage control process. The control signal corrector 54 determines whether the level of the power $p_i$ of the input signal exceeds the threshold value $p_t$ or not, and the label Vth represents a threshold voltage of Vds corresponding to the threshold value $p_t$. When the drain voltage Vds exceeds the threshold voltage Vth, the carrier amplifier 28a increases the drain voltage Vds through the drain voltage control process. The drain voltage Vds is generated in response to the Vds control signal. The Vds control signal is obtained by multiplying $hvds(p_i)$, which is the Vds control coefficient generated by the Vds table and signal generator 52a, by the correction coefficient $hv(p_i)$ output from the correction Vds table 54b. A voltage Vmax is a voltage limit for overvoltage protection of the carrier amplifier 28a.

Figure 6B:
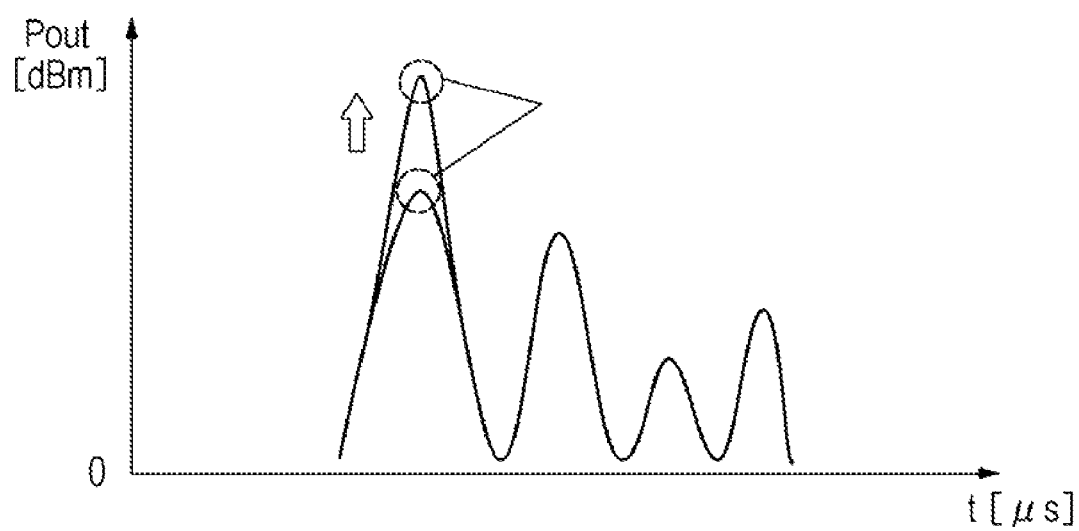

FIG. 6B illustrates an output power Pout of the transmission signal output through the control of the drain voltage Vds as illustrated in FIG. 6A. Due to the control of the drain voltage of the carrier amplifier 28a, the phase of the output of the carrier amplifier 28a is substantially aligned with the phase of the output of the peak amplifier 28b. The output power Pout is thus increased as illustrated in FIG. 6B. The AM-AM characteristics in the vicinity of the peak power of the power amplifier 28 may approach linearity. And the power efficiency of the amplifying device may be increased.

Figure 7:
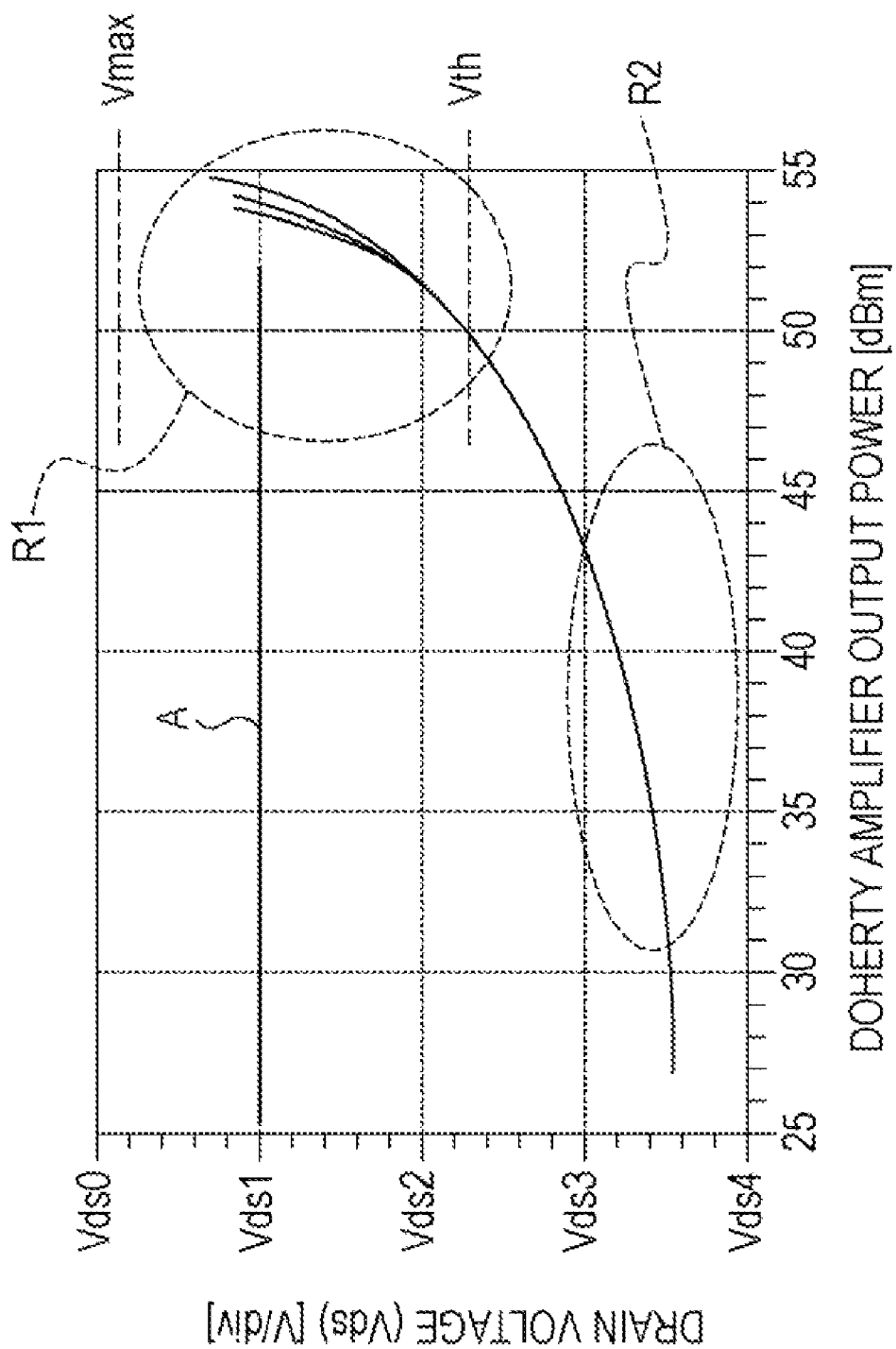
FIG. 7 illustrates a relationship between the drain voltage control process performed by the transmitter apparatus of FIG. 1 and an output power of the transmitter apparatus.

FIG. 7 illustrates the relationship between the output power of the transmission signal output from the power amplifier 28 through the drain voltage control process, and the drain voltage Vds. As illustrated in FIG. 7, the straight line A represents Vds=Vds1 with the drain voltage Vds being at a certain value of Vds1. Vmax represents a voltage limit and Vth represents the threshold value illustrated in FIG. 6A.

Three different curves within a region R1 illustrated in FIG. 7 represent characteristics of the transmitter apparatus 10 that vary depending on ambient environmental conditions such as temperature.

According to the three curves, the output power may be increased more due to the drain voltage control process than with the drain voltage fixed to Vds1.

In a region R2 where the output voltage is low, the drain voltage may be set to be lower than the drain voltage Vds fixed to Vds1. Thus, efficiency of the amplifying device may be increased.

Figure 8A:
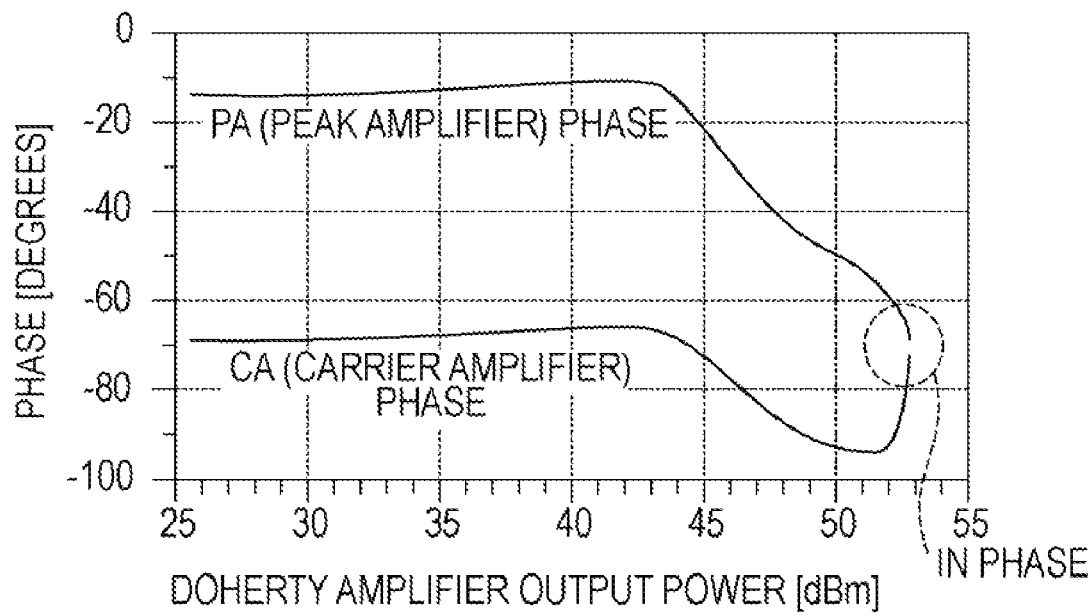
FIG. 8A illustrates phase characteristics of the output of each amplifier in the drain voltage control process of the transmitter apparatus of FIG. 1.
Figure 8B:
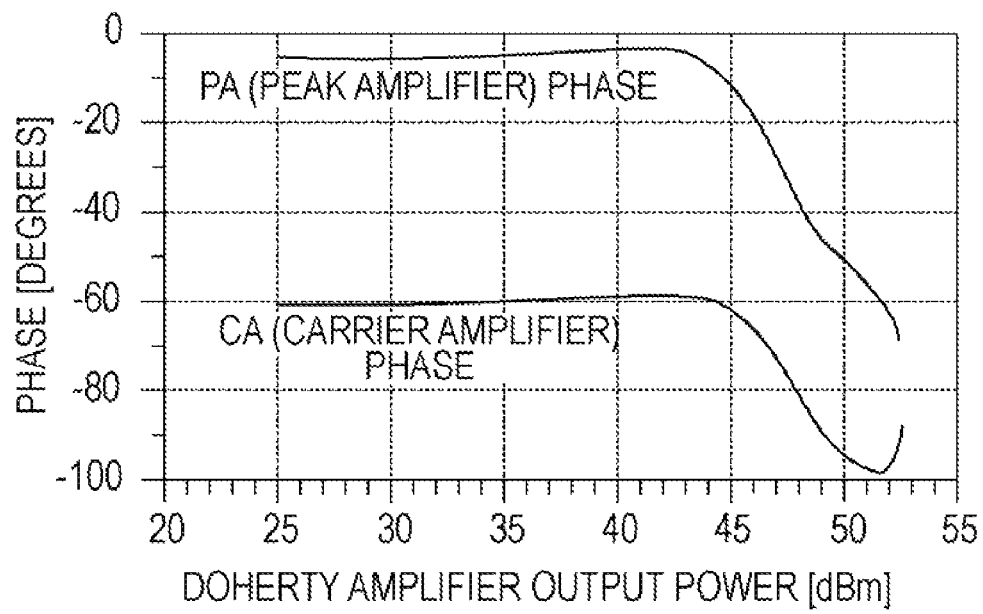
FIG. 8B illustrates phase characteristics of the output of each amplifier in the transmitter apparatus of the related art.

FIG. 8A illustrates the phases of the outputs of the carrier amplifier 28a and the peak amplifier 28b approaching each other in the vicinity of the peak power due to the drain voltage control process accounting for the correction by the control signal corrector 54. On the other hand, FIG. 8B illustrates the phases of the outputs of the carrier amplifier 28a and the peak amplifier 28b not approaching each other in the vicinity of the peak power with the drain voltage Vds fixed to Vds1. FIG. 8A illustrates that the output power of the synthesized signal of the two outputs may be increased by aligning the phase of the output of the carrier amplifier 28a with the phase of the output of the peak amplifier 28b. In practice, the output power was increased from 52.4 dBm to 52.7 dBm.

Figure 9A:
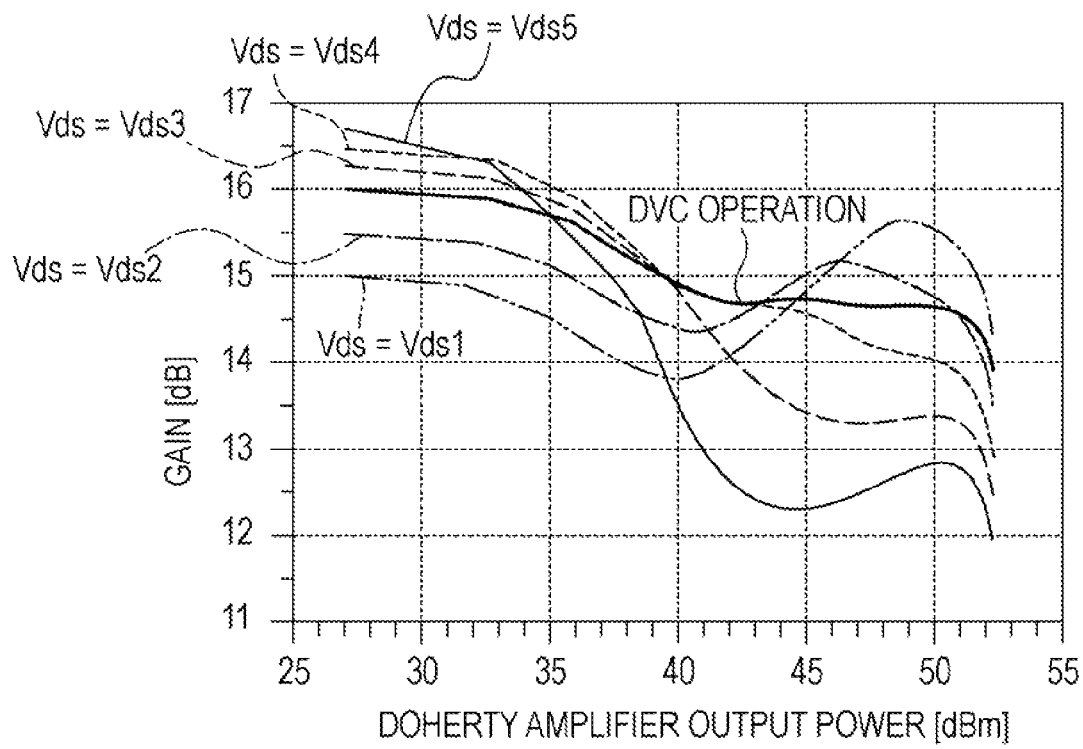
FIGS. 9A and 9B illustrate an effect of the drain voltage control process performed by the transmitter apparatus of FIG. 1.
Figure 9B:
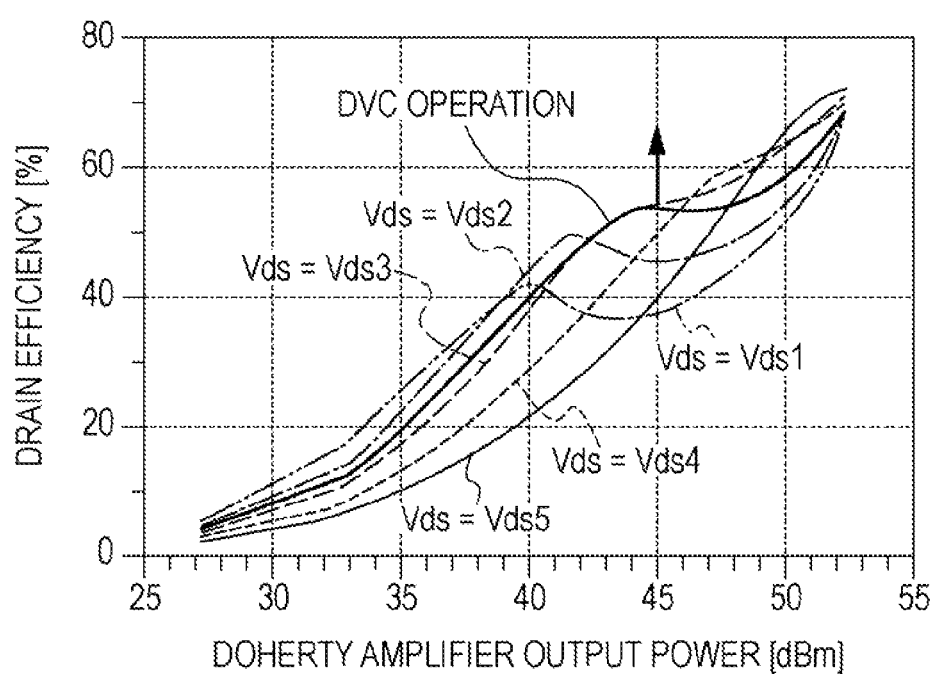
Figure 10A:
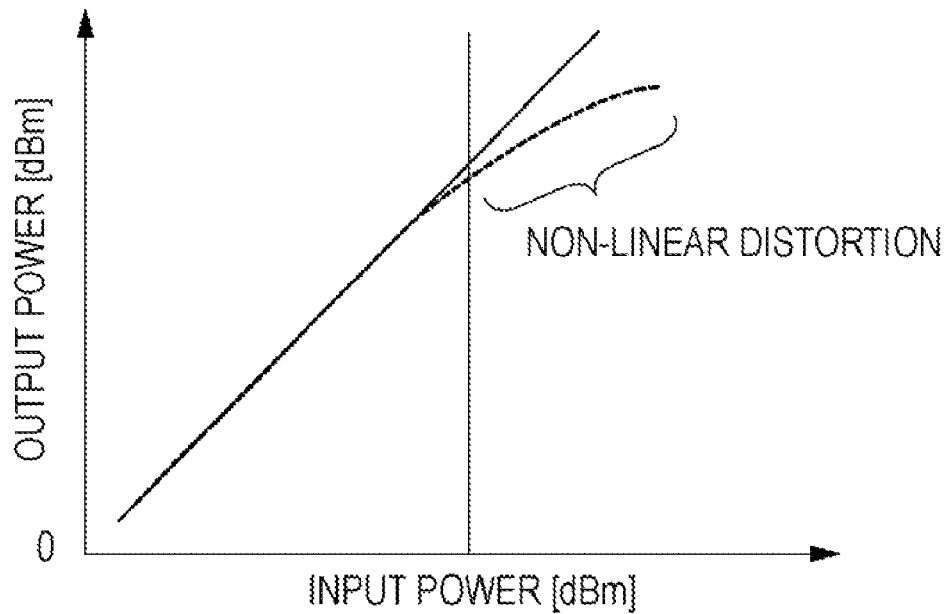
FIGS. 10A and 10B illustrate non-linear distortion of a power amplifier of the related art.
Figure 10B:
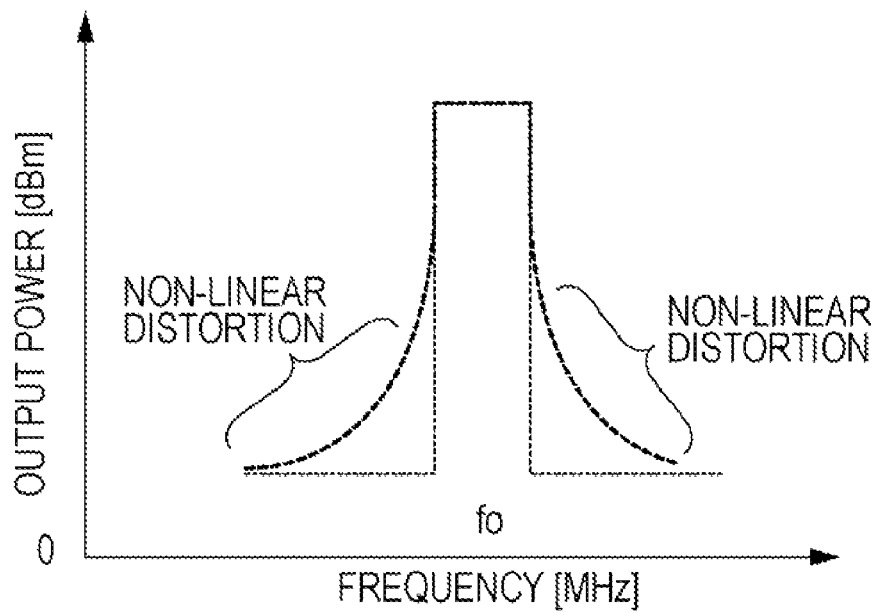
Figure 11A:
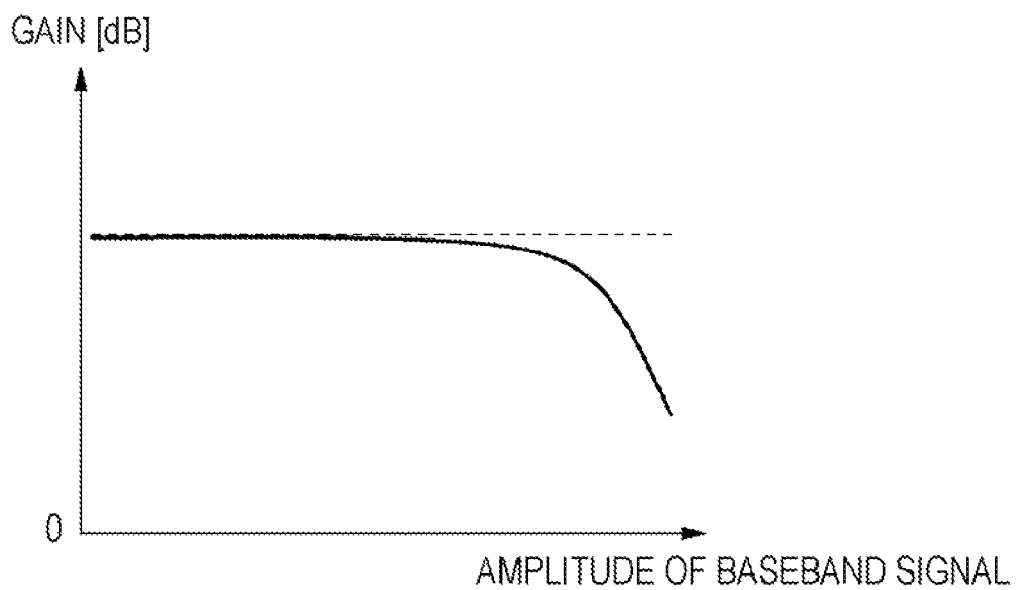
FIGS. 11A and 11B illustrate distortion compensation of the power amplifier.
Figure 11B:
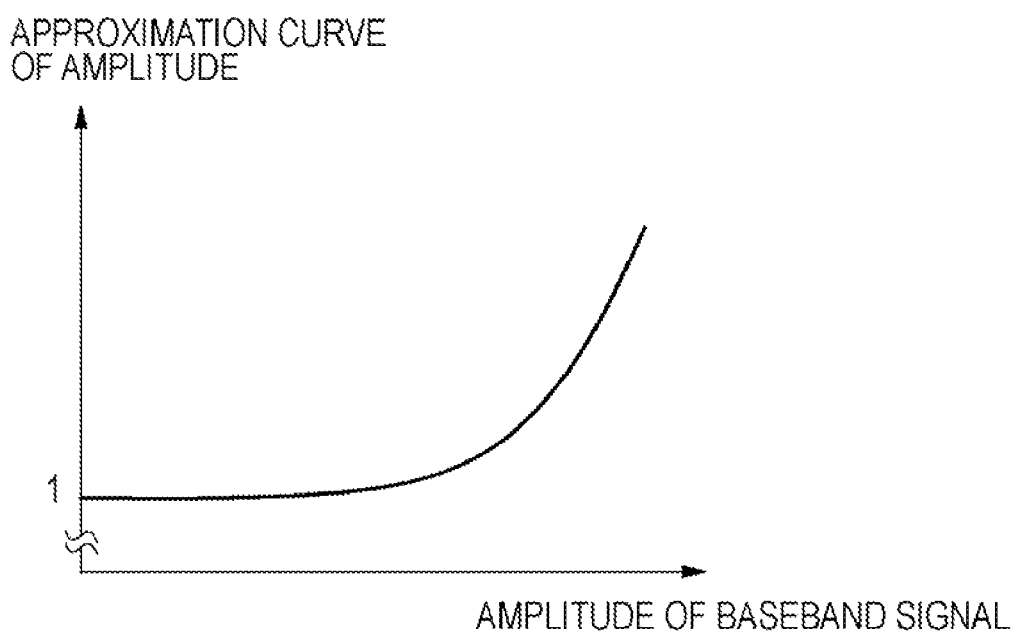
Figure 12:
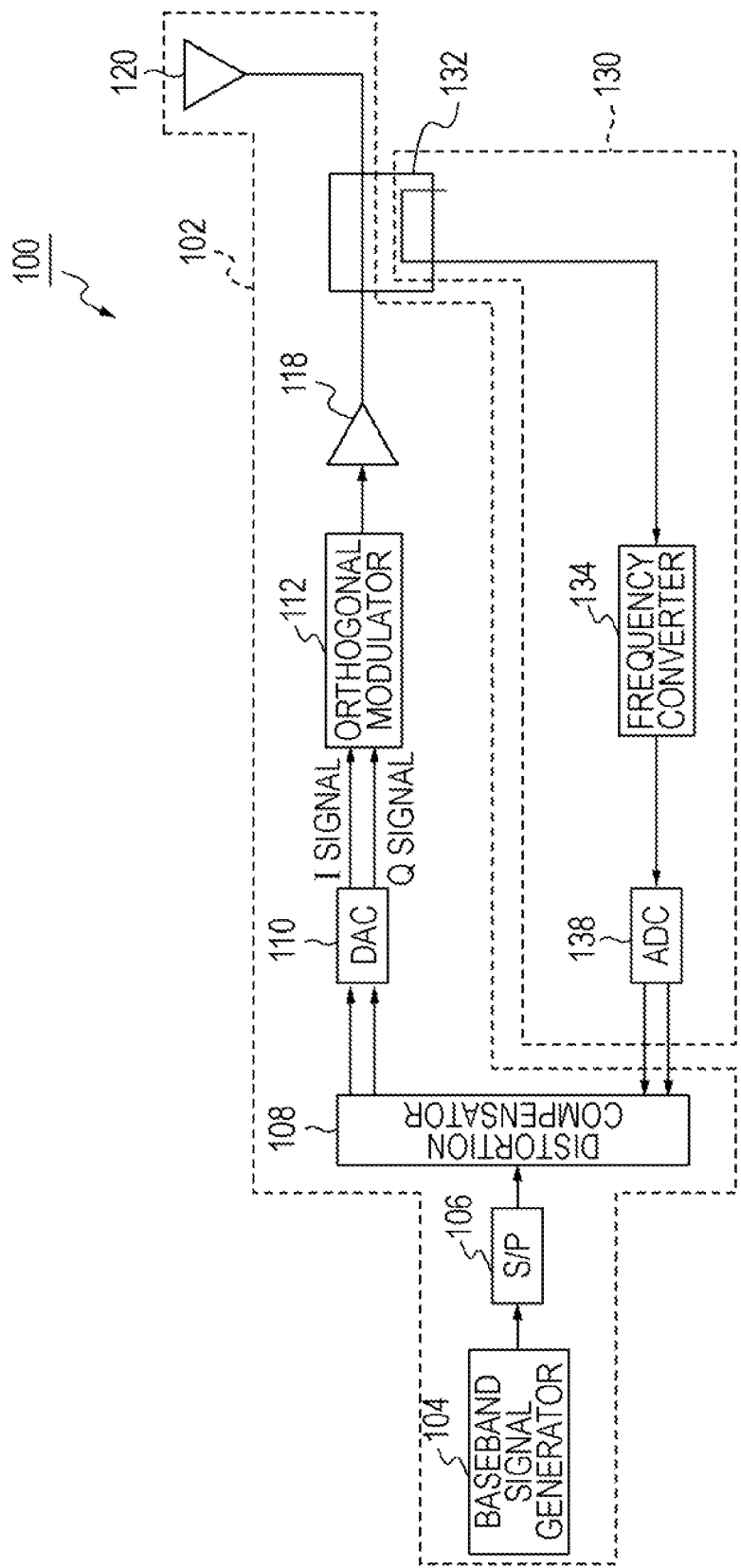
FIG. 12 illustrates a transmitter apparatus of the related art.

FIG. 9A illustrates the effect of the drain voltage control (DVC) operation on gain, and FIG. 9B illustrates an improvement in the drain efficiency caused by the drain voltage control operation.

Referring to FIG. 9A, the drain voltage control operation causes the gain to be flatter and more stable. Referring to FIG. 9B, the drain efficiency is increased at an output power of 45 dBm by about 17% more with the drain voltage control operation activated than with the drain voltage fixed to Vds1 (Vds=Vds1).

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

The invention claimed is:

1. An amplifying device for generating a transmission signal by processing an input signal, and amplifying and transmitting the transmission signal, the amplifying device comprising:
    an amplifier including a first amplifying element with a drain voltage thereof being controlled, and a second amplifying element, the amplifier amplifying the transmission signal with the first and second amplifying elements, synthesizing the transmission signals amplified by the first and second amplifying elements, and outputting the synthesized transmission signal;
    a distortion compensator which performs a distortion operation on the input signal in accordance with a compensation coefficient, the compensation coefficient being derived from a difference between the input signal and a feedback signal generated from a portion of a signal output from the amplifier; and
    a controller part which controls the drain voltage of the first amplifying element in response to a result of a comparison between a power level of the input signal prior to the distortion compensation operation by the distortion compensator part, and a threshold value, wherein the controller part generates a control coefficient as a control signal to control the drain voltage, and includes a corrector part, and
    wherein the corrector part sets a phase of an output of the first amplifying element to be close to a phase of an output of the second amplifying element by generating a correction coefficient correcting the control coefficient so that an absolute value of the compensation coefficient generated by the distortion compensator part decreases when the power level of the input signal exceeds the threshold value.

2. The amplifying device according to claim 1, wherein the distortion compensator part, the controller part, and the corrector part each have a reference table, the reference tables containing a value corresponding to the power level of the input signal, and wherein the compensation coefficient, the control coefficient for use as the control signal of the drain voltage, and the correction coefficient are obtained by referencing the reference tables.

3. The amplifying device according to claim 1, wherein the amplifier comprises a Doherty amplifier including a carrier amplifier and a peak amplifier, wherein the first amplifying element with the drain voltage thereof being controlled corresponds to the carrier amplifier, and wherein the second amplifying element corresponds to the peak amplifier.

4. An amplifying device for generating a transmission signal by processing an input signal, and amplifying and transmitting the transmission signal, the amplifying device comprising:
- an amplifier including a first amplifying element with a drain voltage thereof being controlled, and a second amplifying element, the amplifier amplifying the transmission signal with the first and second amplifying elements, synthesizing the transmission signals amplified by the first and second amplifying elements, and outputting the synthesized transmission signal;
- a distortion compensator part which performs a distortion compensation operation on the input signal in accordance with a compensation coefficient, the compensation coefficient being derived from a difference between the input signal and a feedback signal generated from a portion of a signal output from the amplifier; and
- a controller part which controls the drain voltage of the first amplifying element response to a result of a comparison between a power level of the input signal prior to the distortion compensation operation by the distortion compensator part, and a threshold value, wherein the controller part controls the drain voltage of the first amplifying element so that the drain voltage decreases further in response to the power level of the input signal falling, when the power level of the input signal is equal to or lower than the threshold value.

5. A transmitter apparatus comprising:
- a transmission signal generator part which performs digital-to-analog conversion of an input signal, and generates a transmission signal by orthogonal modulating the digital-to-analog converted input signal;
- an amplifier including a first amplifying element with a drain voltage thereof being controlled, and a second amplifying element, the amplifier amplifying the transmission signal by the first and second amplifying elements, synthesizing the transmission signals amplified by the first and second amplifying elements, and outputting the synthesized transmission signal;
- a distortion compensator which performs a distortion compensation operation on the input signal in accordance with a compensation coefficient prior to the digital-to-analog conversion, the compensation coefficient being derived from a difference between the input signal prior to the digital-to-analog conversion and a feedback signal generated from a portion of a signal output from the amplifier;
- a drain voltage controller part which controls the drain voltage by generating a drain voltage control signal control the drain voltage of the first amplifying element, based on the input signal prior to the distortion compensation operation of the distortion compensator part; and
- a controller art which controls the drain voltage of the first amplifying element to set a phase of an output of the first amplifying element to be closer to a phase of an output of the second amplifying element, in response to a result of a comparison between a power level of the input signal prior to the distortion compensation operation by the distortion compensator part and a threshold value, wherein the controller part generates a control coefficient as a control signal controlling the drain voltage, and includes a corrector part, and
- wherein the corrector part sets a phase of an output of the first amplifying element to be closer to a phase of an output of the second amplifying element by generating a correction coefficient correcting the control coefficient so that an absolute value of the compensation coefficient generated by the distortion compensator part decreases when the power level of the input signal exceeds the threshold value.

6. The transmitter apparatus according to claim 5, wherein the distortion compensator part, the controller part, and the corrector part each have reference tables, the reference tables containing a value corresponding to the power level of the input signal, and wherein the compensation coefficient, the control coefficient of the control signal of the drain voltage, and the correction coefficient generated by the corrector are obtained by referencing the reference tables.

7. The transmitter apparatus according to claim 5, wherein the amplifier comprises a Doherty amplifier including a carrier amplifier and a peak amplifier, wherein the first amplifying element with the drain voltage thereof being controlled corresponds to the carrier amplifier, and wherein the second amplifying element corresponds to the peak amplifier.

8. A transmitter apparatus comprising:
- a transmission signal generator part which performs digital-to-analog conversion of an input signal, and generates a transmission signal by orthogonal modulating the digital-to-analog converted input signal,
- an amplifier including a first amplifying element with a drain voltage thereof being controlled and a second amplifying element, the amplifier amplifying the transmission signal by the first and second amplifying elements, synthesizing the transmission signals amplified by the first and second amplifying elements, and outputting the synthesized transmission signal;
- a distortion compensator part which performs a distortion compensation operation on the input signal in accordance with a compensation coefficient prior to the digital-to-analog conversion, the compensation coefficient being derived from a difference between the input signal prior to the digital-to-analog conversion and a feedback signal generated from a portion of a signal output from the amplifier;
- a drain voltage controller part which controls the drain voltage by generating a drain voltage control signal to control the drain voltage of the first amplifying element, based on the input signal prior to the distortion compensation operation of the distortion compensator part; and
- a controller part which controls the drain voltage of the first amplifying element to set a phase of an output of the first amplifying element to be closer to a phase of an output of the second amplifying element, in response to a result of a comparison between a power level of the input signal prior to the distortion compensation operation by the distortion compensator part and a threshold value, wherein the controller part generates the drain voltage control signal so that the drain voltage decreases further in response to the power level of the input signal falling, when the power level of the input signal is equal to or lower than the threshold value.

* * * * *